United States Patent [19]

Hwang

[11] Patent Number: 5,567,966
[45] Date of Patent: Oct. 22, 1996

[54] LOCAL THINNING OF CHANNEL REGION FOR ULTRA-THIN FILM SOI MOSFET WITH ELEVATED SOURCE/DRAIN

[75] Inventor: Jeong-Mo Hwang, Plano, Tex.

[73] Assignee: Texas Instruments Incorporated, Dallas, Tex.

[21] Appl. No.: 478,310

[22] Filed: Jun. 7, 1995

Related U.S. Application Data

[62] Division of Ser. No. 420,882, Apr. 11, 1995, abandoned, which is a continuation of Ser. No. 128,944, Sep. 29, 1993, abandoned.

[51] Int. Cl.$^6$ .......................... H01L 27/01; H01L 27/12; H01L 29/76
[52] U.S. Cl. .......................... 257/347; 257/382; 257/408; 257/350

[58] Field of Search ...................... 257/347, 348, 257/349, 350, 351, 352, 353, 354, 382, 408

[56] References Cited

U.S. PATENT DOCUMENTS 5,124,768  6/1992  Mano et al. ........................ 257/347

Primary Examiner—Wael M. Fahmy
Attorney, Agent, or Firm—Mark A. Valetti; W. James Brady, III; Richard L. Donaldson

[57] ABSTRACT

An elevated source/drain structure is described in which the channel region is thinned by local oxidation and wet etch while the source/drain region remained thick. This structure achieves source/drain resistances as small as 300 ohm-μm for NMOS, which makes possible high drive currents in deep submicron thin-film SOI/MOSFET.

2 Claims, 2 Drawing Sheets

5,567,966

LOCAL THINNING OF CHANNEL REGION FOR ULTRA-THIN FILM SOI MOSFET WITH ELEVATED SOURCE/DRAIN

This is a division of application Ser. No. 08/420,882, filed Apr. 11, 1995 (which is a continuation of Ser. No. 08/128,944 filed Sep. 29, 1993 now abandoned).

BACKGROUND OF THE INVENTION

Fully-depleted silicon on insulator (SOI) transistors offer higher drive capability and reduced short-channel effects. These advantages become more pronounced for thinner silicon film layers. However, as the silicon film thickness decreases, the source/drain series resistance of a field effect transistor fabricated on the film increases. This series resistance is usually higher than anticipated from what is expected to the reduction of film thickness alone. This higher than expected series resistance is perhaps attributable to incomplete recrystallization after a source/drain implant anneal or perhaps it is attributable to silicidation such as micro-voids formation at a silicide/silicon interface due to the lack of silicon volume. In any case, the series resistance limits the drive capability of the transistor.

SUMMARY OF THE INVENTION

An elevated source/drain structure is provided in which the channel region is thinned by local oxidation.

DETAILED DESCRIPTION OF THE INVENTION

The invention improves the drive capability of a transistor by providing an elevated source/drain structure which is fabricated according to a local thinning method.

Figure 1:
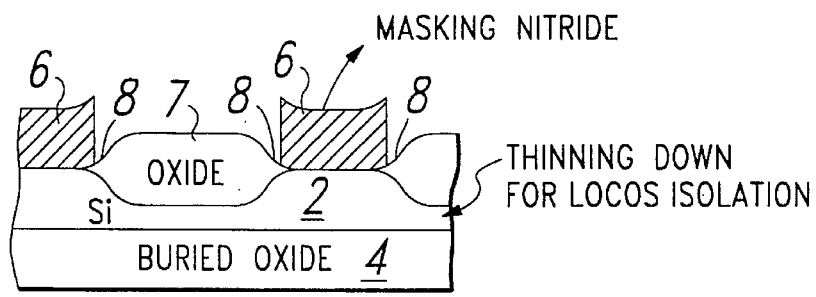
FIGS. 1 through 6 illustrates cross-sectional views of the structure resulting from processing according to the invention.

FIG. 1 illustrates a cross-sectional view of a SOI wafer processed in accordance with the following steps. Silicon film or rather silicon layer 2 can, for example, be 2000–2500 Å and buried oxide 4 can, for example, be 2000–4000 Å. Nitride placed on silicon layer 2 and is patterned and etched to form nitride mask 6. Oxide 7 is grown in the regions not covered by the nitride according to the well known method of local oxidation of silicon, commonly called LOCOS. As expected some birds beaking occurs as indicated at reference numeral 8. The desired thinned silicon area 9, in the channel region of a transistor to be formed, results from the use of a portion of silicon layer 2 to produce the silicon dioxide which forms oxide 7.

Figure 2:
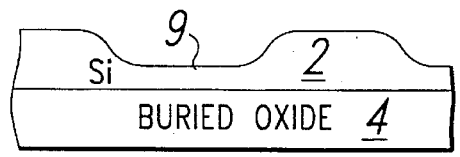

With reference to FIG. 2 which illustrates a cross-sectional view of a SOI wafer processed according to the following steps, the nitride mask and LOCOS oxide shown in FIG. 1 are removed, preferably by a wet etch.

Figure 3:
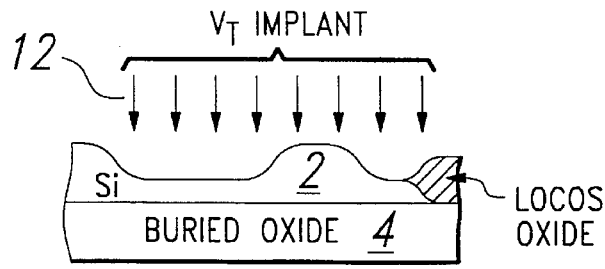

FIG. 3 illustrates a cross-sectional view illustrating the further processing of the structure shown in FIG. 2. LOCOS oxide 10 is grown in order to provide isolation at desired areas. For instance, LOCOS isolation is provided at the edges of a transistor to be fabricated. Note that just a single LOCOS oxide is illustrated in FIG. 3. Next, a voltage threshold implant for a field effect transistor is performed as indicated by reference numeral 12.

Figures 4, 5:
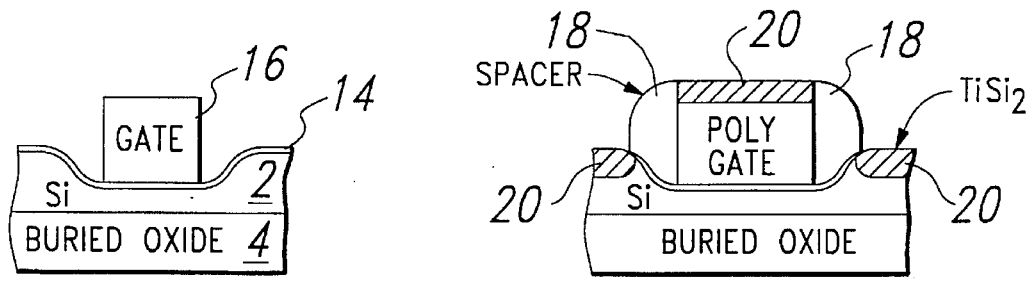

FIG. 4 illustrates a cross-sectional view illustrating the further processing of the structure shown in FIG. 3. Gate oxide 14 is grown over silicon layer 2. A gate 16 is deposited over thinned silicon area 9. Gate 16 can be a poly crystalline silicon gate. A mask is patterned and oxide 14 is etched (not shown). The commonly used lightly doped drain (LDD) can be implanted according to well known methods.

FIG. 5 illustrates a cross-sectional view illustrating the further processing of structure shown in FIG. 4. Sidewall insulator spacers 18 are formed by the deposition overall of an insulator such as oxide. An anisotropic etch is performed leaving only the spacers 18, followed by a source/drain implant (not shown). After an anneal of the structure, titanium is deposited. The titanium reacts with silicon to form $TiSi_2$ (titanium silicide) regions 20. This allows for reduced source/drain resistance.

Figure 6:
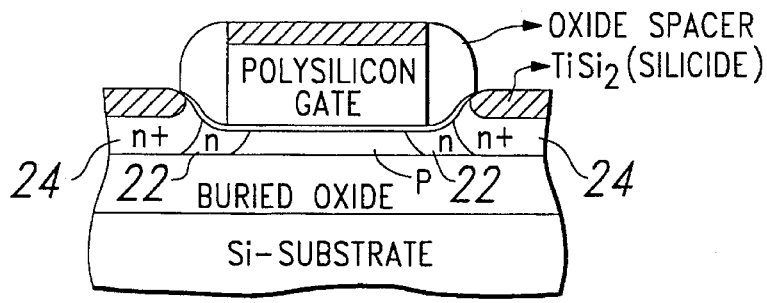

FIG. 6 illustrates a cross-sectional view of the structure formed by the foregoing process steps. Note that LDD regions are indicated by reference numeral 22 and that source/drain regions are indicated at reference numeral 24. This structure can achieve source/drain resistances as small as 300 ohm-µm for NMOS, which makes possible high drive currents in deep submicron thin-film SOI/MOSFET.

In experimental test structures, SIMOX wafers with a 200 nm silicon layer and a 400 nm buried-oxide layer were used. For an elevated source/drain, the silicon in the channel and field areas where thinned down by local oxidation and wet etch, with a resulting silicon thickness of about 60 nm, while the silicon in the source and drain regions remained at 200 nm. LOCOS isolation was employed for smooth topography. The thinned silicon on the field required a relatively thin LOCOS oxide, which reduced bird's beak encroachment. The gate oxide was thermally grown to a thickness of 9 nm. An n+ polysilicon/TiN stacked gate electrode (inverse-T gate) was used to obtain symmetrical CMOS threshold voltages. An LDD structure was employed both for NMOS and PMOS, to improve the drain-to-source breakdown. Since a shallow source/drain junction is not necessary in thin-film SOI transistors, phosphorus was used for the n-channel source/drain implant instead of arsenic to further improve the series resistance. Source/drain implant anneal was done by rapid thermal anneal (RTA) (950° C., 30 seconds). A salicide process was employed using 50 nm of titanium to further reduce source/drain resistance. Note that the relative doping concentrations of an n-channel device are shown (eg. n and n+) in FIG. 6. The invention is particularly well suited for MOSFETs.

Figure 7:
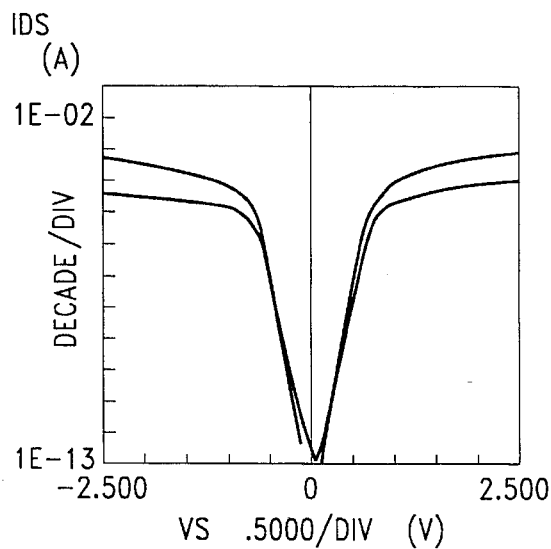
FIGS. 7–10 illustrate performance graphs of device characteristics of test structures made according to the invention.
Figure 8:
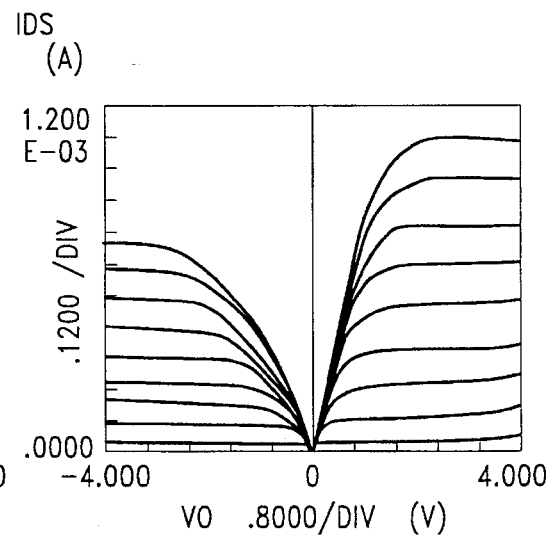
Figure 9:
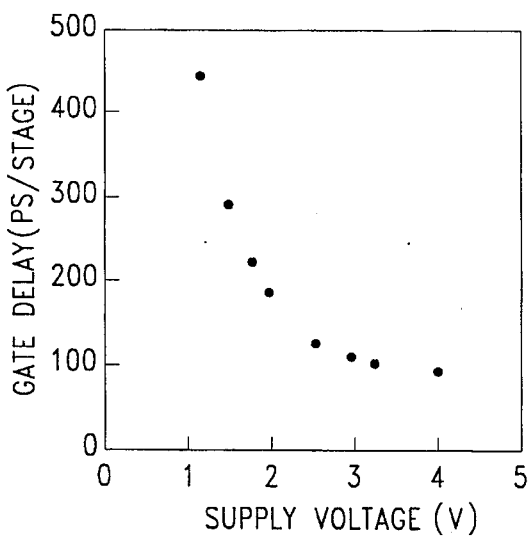
Figure 10:
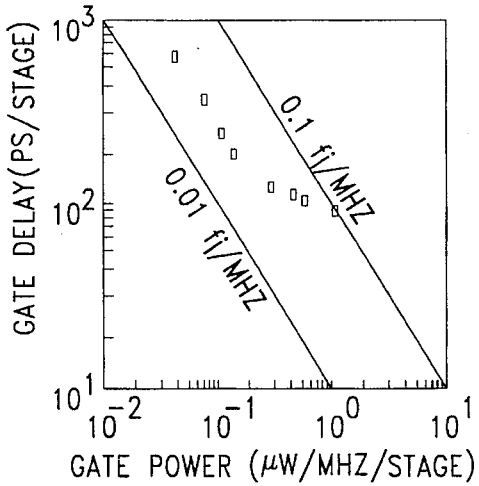

FIG. 7 shows subthreshold characteristics for NMOS and PMOS transistors for the test structure. IDS indicates the current from drain to source. The subthreshold slopes are similar, being about 70 mV/dec for 0.5 µm gate length transistors. Those for long channel devices are about 63 to 65 mV/dec., which is close to the ideal value. The absolute threshold voltage for NMOS transistors is found to be about 0.75 V and slightly larger than that for PMOS transistors (0.6 V), even for the same channel doping densities of 1.0 E17/cm$^3$. Further threshold adjustments can be achieved by optimizing the channel doping. Excellent drain I–V characteristics are shown in FIG. 8. As expected, the elevated source/drain structure offers very low series resistance which is estimated to be about 400 ohm-µm for NMOS and 1,600 ohm-µm for PMOS transistors. The saturation transconductances and drain currents at $|V_g=V_d|= 3.3$ V for 0.5 µm gate length NMOS and PMOS devices are typically about 180 mS/ram and 96 mS/ram, and 410 μA/μm and 220 μA/μm, respectively. Typical gate delays obtained from 1751-stage CMOS ring oscillators with 0.6 μm gate-lengths are shown in FIGS. 9 and 10. The ring oscillators work for power supply voltages as low as 0.8 V. The power-delay products are about 0.02 fJ/MHz at 3.3 v. Such deep-sub-femtojoule power delay products are very attractive for low-power applications. These values are significantly lower than those of conventional SOI devices.

Although the invention has been described in detail herein with reference to its preferred embodiment and certain described alternatives, it is to be understood that this description is by way of example only, and it is not to be construed in a limiting sense. For instance, although silicon on insulator wafers are discussed, other semiconductor on insulator devices can be made according to the invention. It is to be further understood that numerous changes in the details of the embodiments of the invention, and additional embodiments of the invention may be made by persons of ordinary skill in the art having reference to this description. It is contemplated that all such changes and additional embodiments are within the spirit and true scope of the invention as claimed below.

We claim:

1. A semiconductor-on-insulator transistor having elevated source/drain regions and a channel, said transistor comprising:

a semiconductor substrate;

an insulating layer situated on and abutting said semiconductor substrate;

a semiconductor layer situated on and abutting said insulating layer, said semiconductor layer having a thin portion, thicker portions, and transition portions where the layer transitions from the thicker portions to the thinner portion;

a gate structure insulatively disposed over said thin portion of said semiconductor layer; and wherein the channel is situated in said thin portion of said semiconductor layer, lightly doped diffusion regions are situated in said transition portions of said semiconductor layer, and said elevated source/drain regions are situated in said thicker portions of said semiconductor layer.

2. The transistor of claim 1, wherein said elevated source/drain regions and said gate structure are at least partially silicided.

* * * * *